(12) United States Patent
Khlat

(10) Patent No.: US 11,082,007 B2
(45) Date of Patent: Aug. 3, 2021

(54) ENVELOPE TRACKING INTEGRATED CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/514,051

(22) Filed: Jul. 17, 2019

(65) Prior Publication Data

US 2020/0204116 A1  Jun. 25, 2020

Related U.S. Application Data

(60) Provisional application No. 62/782,103, filed on Dec. 19, 2018.

(51) Int. Cl.
*H03F 3/04* (2006.01)
*H03F 1/02* (2006.01)
(Continued)

(52) U.S. Cl.
CPC .............. *H03F 1/02* (2013.01); *H03F 3/24* (2013.01); *H02M 3/07* (2013.01); *H03F 1/0211* (2013.01);
(Continued)

(58) Field of Classification Search
CPC ..... H03F 1/02; H03F 3/24; H03F 3/04; H03F 1/0244; H03F 1/0211; H03F 2200/504; H03G 3/3042; H03G 3/3036; H03G 3/001
(Continued)

(56) References Cited

U.S. PATENT DOCUMENTS 5,838,732 A   11/1998   Carney
6,107,862 A   8/2000    Mukainakano et al.
(Continued)

FOREIGN PATENT DOCUMENTS

EP   3174199 A2   5/2017

OTHER PUBLICATIONS

Notice of Allowance for U.S. Appl. No. 16/155,127, dated Jun. 1, 2020, 8 pages.
(Continued)

*Primary Examiner* — Khanh V Nguyen
(74) *Attorney, Agent, or Firm* — Withrow & Terranova, P.L.L.C.

(57) ABSTRACT

An envelope tracking (ET) integrated circuit (IC) (ETIC) is provided. The ETIC includes a number of ET circuits coupled to a number of amplifier circuits configured to amplify a radio frequency signal based on a number of ET voltages, respectively. The ET circuits are configured to generate the ET voltages based on a number of ET target voltages, respectively. The ETIC includes a reference ET circuit configured to generate a reference ET voltage based on a maximum ET target voltage among the ET target voltages. A selected ET circuit(s) among the ET circuits may be configured to not generate a respective ET voltage(s) but instead forward the reference ET voltage to a respective amplifier circuit(s) as the respective ET voltage(s). Hence, it may be possible to partially or completely turn off the selected ET circuit(s) to help reduce peak battery current and improve heat dissipation in an ET amplifier apparatus.

20 Claims, 2 Drawing Sheets

Figure 1:
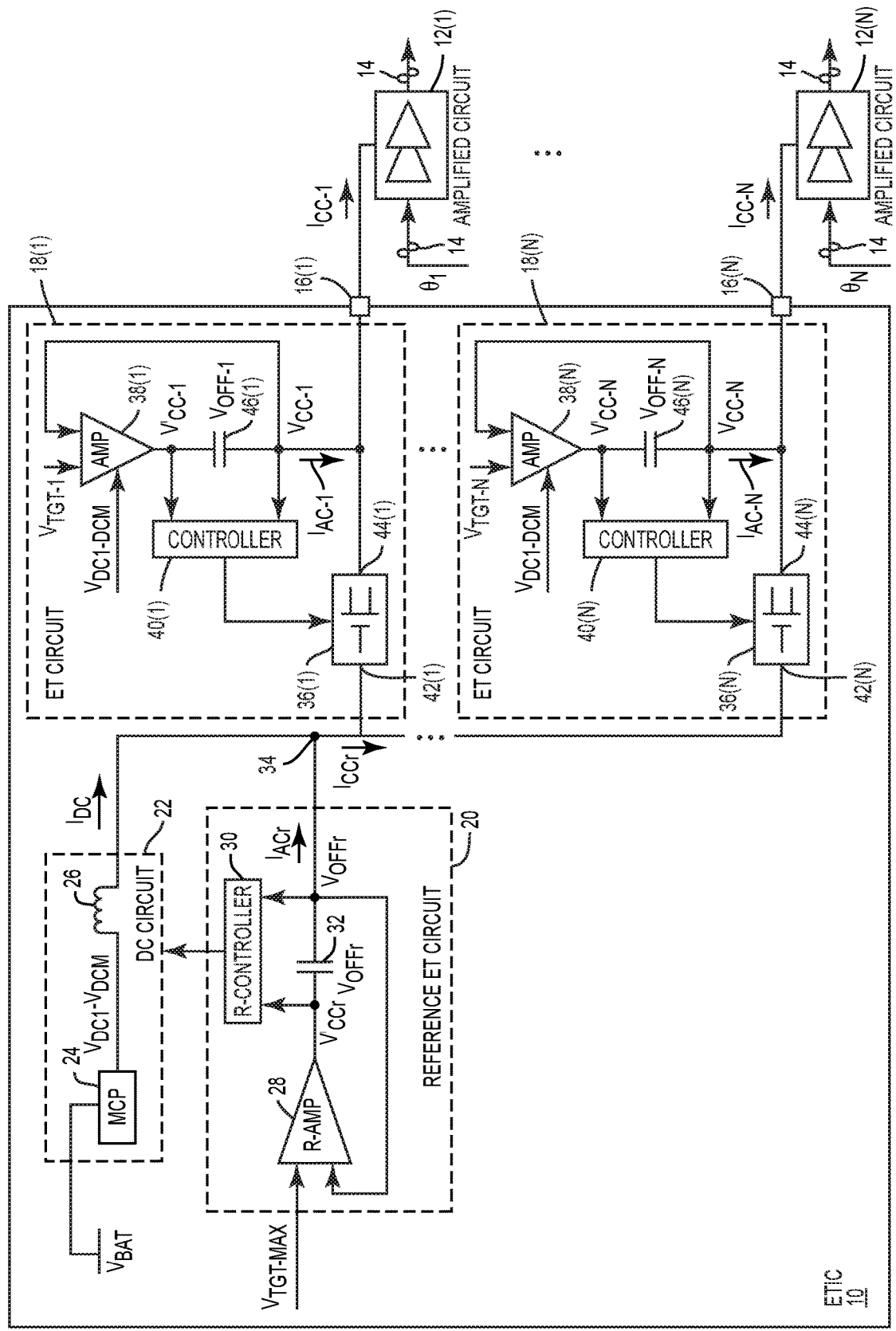

(51) Int. Cl.
*H03F 3/24* (2006.01)
*H02M 3/07* (2006.01)

(52) U.S. Cl.
CPC ...... *H03F 1/0244* (2013.01); *H03F 2200/102* (2013.01); *H03F 2200/451* (2013.01); *H03F 2203/21106* (2013.01)

(58) Field of Classification Search
USPC .......................................................... 330/297
See application file for complete search history.

(56) References Cited

U.S. PATENT DOCUMENTS

| | | | |
|---|---|---|---|
| 6,141,377 A | 10/2000 | Sharper et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 8,461,928 B2 | 6/2013 | Yahav et al. | |
| 8,476,976 B2 | 7/2013 | Wimpenny | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2* | 5/2014 | Balteanu ................ H03F 1/02 375/297 | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,989,682 B2 | 3/2015 | Ripley et al. | |
| 9,020,451 B2 | 4/2015 | Khlat | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,377,797 B2 | 6/2016 | Kay et al. | |
| 9,379,667 B2 | 6/2016 | Khlat et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,923,520 B1 | 3/2018 | Abdelfattah et al. | |
| 10,003,416 B1 | 6/2018 | Lloyd | |
| 10,090,808 B1 | 10/2018 | Henzler et al. | |
| 10,097,145 B1 | 10/2018 | Khlat et al. | |
| 10,110,169 B2 | 10/2018 | Khesbak et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,181 B2 | 5/2019 | Kim et al. | |
| 10,326,408 B2* | 6/2019 | Khlat ........................ H03F 3/68 | |
| 10,382,071 B2 | 8/2019 | Rozek et al. | |
| 10,439,557 B2* | 10/2019 | Khlat ........................ H03F 3/20 | |
| 10,476,437 B2* | 11/2019 | Nag ........................... H03F 1/02 | |
| 2002/0167827 A1 | 11/2002 | Umeda et al. | |
| 2004/0266366 A1 | 12/2004 | Robinson et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0240786 A1 | 10/2006 | Liu | |
| 2007/0052474 A1 | 3/2007 | Saito | |
| 2007/0258602 A1 | 11/2007 | Vepsalainen et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0308919 A1 | 12/2010 | Adamski et al. | |
| 2011/0074373 A1 | 3/2011 | Lin | |
| 2011/0136452 A1 | 6/2011 | Pratt et al. | |
| 2011/0175681 A1 | 7/2011 | Inamori et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 | 11/2012 | Southcombe et al. | |
| 2012/0299647 A1 | 11/2012 | Honjo et al. | |
| 2013/0021827 A1 | 1/2013 | Ye | |
| 2013/0100991 A1 | 4/2013 | Woo | |
| 2013/0130724 A1 | 5/2013 | Kumar Reddy et al. | |
| 2013/0162233 A1 | 6/2013 | Marty | |
| 2013/0187711 A1 | 7/2013 | Goedken et al. | |
| 2013/0200865 A1 | 8/2013 | Wimpenny | |
| 2013/0271221 A1 | 10/2013 | Levesque et al. | |
| 2014/0009226 A1 | 1/2014 | Severson | |
| 2014/0028370 A1 | 1/2014 | Wimpenny | |
| 2014/0028390 A1 | 1/2014 | Davis | |
| 2014/0057684 A1 | 2/2014 | Khlat | |
| 2014/0103995 A1 | 4/2014 | Langer | |
| 2014/0155002 A1 | 6/2014 | Dakshinamurthy et al. | |
| 2014/0184335 A1 | 7/2014 | Nobbe et al. | |
| 2014/0199949 A1 | 7/2014 | Nagode et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2014/0361837 A1 | 12/2014 | Strange et al. | |
| 2015/0048883 A1 | 2/2015 | Vinayak | |
| 2015/0071382 A1 | 3/2015 | Wu et al. | |
| 2015/0098523 A1 | 4/2015 | Lim et al. | |
| 2015/0155836 A1 | 6/2015 | Midya et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0126900 A1 | 5/2016 | Shute | |
| 2016/0173031 A1 | 6/2016 | Langer | |
| 2016/0181995 A1 | 6/2016 | Nentwig et al. | |
| 2016/0187627 A1 | 6/2016 | Abe | |
| 2016/0197627 A1 | 7/2016 | Qin et al. | |
| 2016/0226448 A1 | 8/2016 | Wimpenny | |
| 2016/0294587 A1 | 10/2016 | Jiang et al. | |
| 2017/0141736 A1 | 5/2017 | Pratt et al. | |
| 2017/0302183 A1 | 10/2017 | Young | |
| 2017/0317913 A1 | 11/2017 | Kim et al. | |
| 2017/0338773 A1 | 11/2017 | Balteanu et al. | |
| 2018/0013465 A1* | 1/2018 | Chiron ..................... H03F 3/245 | |
| 2018/0048265 A1 | 2/2018 | Nentwig | |
| 2018/0048276 A1 | 2/2018 | Khlat et al. | |
| 2018/0076772 A1 | 3/2018 | Khesbak et al. | |
| 2018/0123453 A1 | 5/2018 | Puggelli et al. | |

(56) References Cited

U.S. PATENT DOCUMENTS

| | | |
|---|---|---|
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1* | 1/2020 | Khlat ........................ H03F 3/68 |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2021/0099135 A1 | 4/2021 | Balteanu et al. |

OTHER PUBLICATIONS

Corrected Notice of Allowability for U.S. Appl. No. 15/888,300, dated May 13, 2020, 7 pages.

Non-Final Office Action for U.S. Appl. No. 16/246,859, dated Apr. 28, 2020, 9 pages.

Notice of Allowance for U.S. Appl. No. 16/354,234, dated Apr. 24, 2020, 9 pages.

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

Notice of Allowance for U.S. Appl. No. 15/728,202, dated Aug. 2, 2018, 7 pages.

Non-Final Office Action for U.S. Appl. No. 15/888,300, dated Aug. 28, 2018, 11 pages.

Notice of Allowance for U.S. Appl. No. 15/792,909, dated Dec. 19, 2018, 11 pages.

Notice of Allowance for U.S. Appl. No. 15/993,705, dated Oct. 31, 2018, 7 pages.

Pfister, Henry, "Discrete-Time Signal Processing," Lecture Note, pfister.ee.duke.edu/courses/ece485/dtsp.pdf, Mar. 3, 2017, 22 pages.

Non-Final Office Action for U.S. Appl. No. 15/888,260, dated May 2, 2019, 14 pages.

Non-Final Office Action for U.S. Appl. No. 15/986,948, dated Mar. 28, 2019, 8 pages.

Non-Final Office Action for U.S. Appl. No. 16/018,426, dated Apr. 11, 2019, 11 pages.

Supplemental Notice of Allowability for U.S. Appl. No. 15/902,244, dated Mar. 20, 2019, 6 pages.

Notice of Allowance for U.S. Appl. No. 15/902,244, dated Feb. 8, 2019, 8 pages.

Advisory Action for U.S. Appl. No. 15/888,300, dated Jun. 5, 2019, 3 pages.

Notice of Allowance for U.S. Appl. No. 15/984,566, dated May 21, 2019, 6 pages.

Notice of Allowance for U.S. Appl. No. 16/150,556, dated Jul. 29, 2019, 7 pages.

Non-Final Office Action for U.S. Appl. No. 15/888,300, dated Jun. 27, 2019, 17 pages.

Final Office Action for U.S. Appl. No. 15/986,948, dated Aug. 27, 2019, 9 pages.

Advisory Action for U.S. Appl. No. 15/986,948, dated Nov. 8, 2019, 3 pages.

Notice of Allowance for U.S. Appl. No. 15/986,948, dated Dec. 13, 2019, 7 pages.

Final Office Action for U.S. Appl. No. 16/018,426, dated Sep. 4, 2019, 12 pages.

Advisory Action for U.S. Appl. No. 16/018,426, dated Nov. 19, 2019, 3 pages.

Notice of Allowance for U.S. Appl. No. 16/180,887, dated Jan. 13, 2020, 8 pages.

Non-Final Office Action for U.S. Appl. No. 16/122,611, dated Mar. 11, 2020, 16 pages.

Notice of Allowance for U.S. Appl. No. 15/888,300, dated Jan. 14, 2020, 11 pages.

Corrected Notice of Allowability for U.S. Appl. No. 15/888,300, dated Feb. 25, 2020, 7 pages.

Notice of Allowance for U.S. Appl. No. 16/018,426, dated Mar. 31, 2020, 7 pages.

Non-Final Office Action for U.S. Appl. No. 16/174,535, dated Feb. 4, 2020, 7 pages.

Quayle Action for U.S. Appl. No. 16/354,234, mailed Mar. 6, 2020, 8 pages.

Final Office Action for U.S. Appl. No. 16/122,611, dated Sep. 18, 2020, 17 pages.

Final Office Action for U.S. Appl. No. 16/174,535, dated Jul. 1, 2020, 7 pages.

Notice of Allowance for U.S. Appl. No. 16/246,859, dated Sep. 18, 2020, 8 pages.

Non-Final Office Action for U.S. Appl. No. 16/284,023, dated Jun. 24, 2020, 7 pages.

Quayle Action for U.S. Appl. No. 16/421,905, mailed Aug. 25, 2020, 5 pages.

Non-Final Office Action for U.S. Appl. No. 16/435,940, dated Jul. 23, 2020, 6 pages.

Non-Final Office Action for U.S. Appl. No. 16/774,060, dated Aug. 17, 2020, 6 pages.

Notice of Allowance for U.S. Appl. No. 16/549,062, dated Dec. 18, 2020, 9 pages.

Notice of Allowance for U.S. Appl. No. 16/122,611, dated Jan. 13, 2021, 8 pages.

Notice of Allowance for U.S. Appl. No. 16/284,023, dated Jan. 19, 2021, 7 pages.

Notice of Allowance for U.S. Appl. No. 16/416,812, dated Feb. 16, 2021, 8 pages.

Non-Final Office Action for U.S. Appl. No. 16/689,236 dated Mar. 2, 2021, 15 pages.

Notice of Allowance for U.S. Appl. No. 16/435,940, dated Dec. 21, 2020, 7 pages.

Notice of Allowance for U.S. Appl. No. 16/774,060, dated Feb. 3, 2021, 7 pages.

Notice of Allowance for U.S. Appl. No. 16/590,790, dated Jan. 27, 2021, 7 pages.

Notice of Allowance for U.S. Appl. No. 16/661,061, dated Feb. 10, 2021, 7 pages.

Notice of Allowance for U.S. Appl. No. 16/122,611, dated Dec. 1, 2020, 9 pages.

Advisory Action for U.S. Appl. No. 16/174,535, dated Sep. 24, 2020, 3 pages.

Notice of Allowance for U.S. Appl. No. 16/174,535, dated Oct. 29, 2020, 7 pages.

Final Office Action for U.S. Appl. No. 16/284,023, dated Nov. 3, 2020, 7 pages.

Non-Final Office Action for U.S. Appl. No. 16/416,812, dated Oct. 16, 2020, 8 pages.

Quayle Action for U.S. Appl. No. 16/589,940, mailed Dec. 4, 2020, 8 pages.

Notice of Allowance for U.S. Appl. No. 16/122,611, dated Apr. 1, 2021, 8 pages.

Notice of Allowance for U.S. Appl. No. 16/689,236 dated Jun. 9, 2021, 7 pages.

Non-Final Office Action for U.S. Appl. No. 16/775,554, dated Jun. 14, 2021, 5 pages.

(56) References Cited

OTHER PUBLICATIONS

Non-Final Office Action for U.S. Appl. No. 16/582,471, dated Mar. 24, 2021, 11 pages.
Non-Final Office Action for U.S. Appl. No. 16/597,952, dated May 26, 2021, 7 pages.
Notice of Allowance for U.S. Appl. No. 16/689,521, dated May 13, 2021, 7 pages.
Notice of Allowance for U.S. Appl. No. 16/582,471, dated Jun. 22, 2021, 9 pages.

* cited by examiner

ENVELOPE TRACKING INTEGRATED CIRCUIT AND RELATED APPARATUS

RELATED APPLICATIONS

This application claims the benefit of provisional patent application Ser. No. 62/782,103, filed Dec. 19, 2018, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) new radio (NR) (5G-NR) wireless communication technology has been widely regarded as the next wireless communication standard beyond the current third-generation (3G) communication standard, such as wideband code division multiple access (WCDMA), and fourth-generation (4G) communication standard, such as long-term evolution (LTE). As such, a 5G-NR capable mobile communication device is expected to achieve significantly higher data rates, improved coverage range, enhanced signaling efficiency, and reduced latency compared to a conventional mobile communication device supporting only the 3G and 4G communication standards.

The 5G-NR capable mobile communication device can be configured to transmit a radio frequency (RF) signal(s) in a millimeter wave (mmWave) RF spectrum(s), such as an RF spectrum above 28 GHz. RF signals transmitted in the mmWave RF spectrum are susceptible to attenuation and interference. In this regard, the 5G-NR capable mobile communication device typically employs power amplifier phase array and antenna array to shape the RF signal(s) into a directional RF beam(s) for transmission in the mmWave RF spectrum(s). Depending on the application scenarios supported by the 5G-NR capable mobile communication device, the power amplifier phase array may be configured to include from tens to hundreds of power amplifiers. Notably, power amplifiers in the power amplifier phase array can generate excessive heat when operating at suboptimal efficiency. As such, it may be desirable to improve operating efficiency of the power amplifier phase array to help reduce heat dissipation in the 5G-NR capable mobile communication device.

Envelope tracking (ET) is a power management technology designed to improve efficiency levels of the power amplifiers in the power amplifier phase array to help reduce power consumption and thermal dissipation in the 5G-NR capable mobile communication device. In an ET system, each of the power amplifiers is configured to amplify the RF signal(s) based on a time-variant ET voltage generated in accordance with a time-variant power envelope of the RF signal(s). The time-variant ET voltage increases as the time-variant power envelope rises and decreases as the time-variant power envelope falls. Understandably, the better the time-variant ET voltage tracks the time-variant power envelope, the higher efficiency can be achieved in the power amplifiers. In this regard, it may be desirable to enable ET in the 5G-NR capable mobile communication device to help improve the efficiency levels of the power amplifiers in the power amplifier phase array.

SUMMARY

Embodiments of the disclosure relate to an envelope tracking (ET) integrated circuit (IC) (ETIC) and related ET amplifier apparatus. The ETIC includes a number of ET circuits coupled to a number of amplifier circuits configured to amplify a radio frequency (RF) signal based on a number of ET voltages, respectively. The ET circuits are configured to generate the ET voltages based on a number of ET target voltages, respectively. The ETIC also includes a reference ET circuit configured to generate a reference ET voltage based on a maximum ET target voltage among the ET target voltages. In examples discussed herein, a selected ET circuit(s) among the ET circuits is originally configured to generate a respective ET voltage(s) based on a respective ET target voltage(s) that happens to be the maximum ET target voltage. In this regard, the selected ET circuit(s) may be configured not to generate the respective ET voltage(s). Instead, the selected ET circuit may forward the reference ET voltage to a respective amplifier circuit(s) as the respective ET voltage. As such, it may be possible to partially or completely turn off the selected ET circuit(s), thus helping to reduce peak battery current and improve heat dissipation in an ET amplifier apparatus incorporating the ETIC.

In one aspect, an ETIC is provided. The ETIC includes a number of amplifier ports coupled to a number of amplifier circuits configured to amplify an RF signal based on a number of ET voltages, respectively. The ETIC also includes a number of ET circuits coupled to the amplifier ports, respectively. The ET circuits are configured to generate the ET voltages based on a number of ET target voltages, respectively. The ET circuits are also configured to provide the ET voltages to the amplifier ports, respectively. The ETIC also includes a reference ET circuit. The reference ET circuit is configured to generate a reference ET voltage based on a maximum ET target voltage among the ET target voltages. The reference ET circuit is also configured to provide the reference ET voltage to the ET circuits. At least one selected ET circuit among the ET circuits is configured to stop providing a respective ET voltage among the ET voltages to at least one selected amplifier port coupled to the at least one selected ET circuit. The at least one selected ET circuit among the ET circuits is also configured to provide the reference ET voltage to the at least one selected amplifier port coupled to the at least one selected ET circuit.

In another aspect, an ET amplifier apparatus is provided. The ET amplifier apparatus includes a number of amplifier circuits configured to amplify an RF signal based on a number of ET voltages, respectively. The ET amplifier apparatus also include an ETIC. The ETIC includes a number of amplifier ports coupled to the amplifier circuits, respectively. The ETIC also includes a number of ET circuits coupled to the amplifier ports, respectively. The ET circuits are configured to generate the ET voltages based on a number of ET target voltages, respectively. The ET circuits are also configured to provide the ET voltages to the amplifier ports, respectively. The ETIC also includes a reference ET circuit. The reference ET circuit is configured to generate a reference ET voltage based on a maximum ET target voltage among the ET target voltages. The reference ET circuit is also configured to provide the reference ET voltage to the ET circuits. At least one selected ET circuit among the ET circuits is configured to stop providing a respective ET voltage among the ET voltages to at least one selected amplifier port coupled to the at least one selected ET circuit. The at least one selected ET circuit among the ET circuits is also configured to provide the reference ET voltage to the at least one selected amplifier port coupled to the at least one selected ET circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
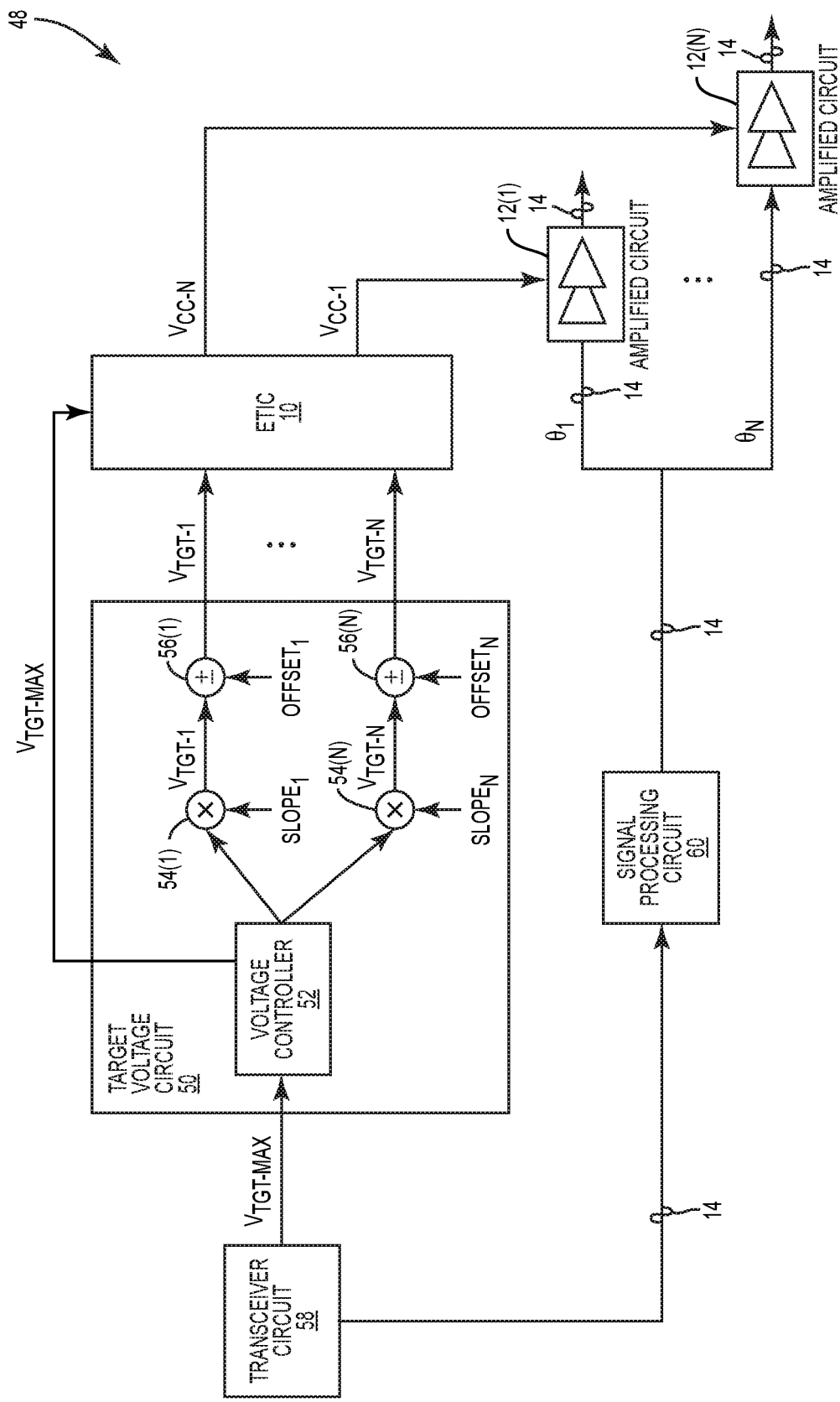

FIG. 1 is a schematic diagram of an exemplary envelope tracking (ET) integrated circuit (IC) (ETIC) configured according to an embodiment of the present disclosure to provide a number of ET voltages to a number of amplifier circuits for amplifying a radio frequency (RF) signal; and FIG. 2 is a schematic diagram of an exemplary ET amplifier apparatus incorporating the ETIC of FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (IC) (ETIC) and related ET amplifier apparatus. The ETIC includes a number of ET circuits coupled to a number of amplifier circuits configured to amplify a radio frequency (RF) signal based on a number of ET voltages, respectively. The ET circuits are configured to generate the ET voltages based on a number of ET target voltages, respectively. The ETIC also includes a reference ET circuit configured to generate a reference ET voltage based on a maximum ET target voltage among the ET target voltages. In examples discussed herein, a selected ET circuit(s) among the ET circuits is originally configured to generate a respective ET voltage(s) based on a respective ET target voltage(s) that happens to be the maximum ET target voltage. In this regard, the selected ET circuit(s) may be configured to not generate the respective ET voltage(s). Instead, the selected ET circuit may forward the reference ET voltage to a respective amplifier circuit(s) as the respective ET voltage. As such, it may be possible to partially or completely turn off the selected ET circuit(s), thus helping to reduce peak battery current and improve heat dissipation in an ET amplifier apparatus incorporating the ETIC.

In this regard, FIG. 1 is a schematic diagram of an exemplary ETIC 10 configured according to an embodiment of the present disclosure to provide a number of ET voltages $V_{CC\text{-}1}$-$V_{CC\text{-}N}$ to a number of amplifier circuits 12(1)-12(N) for amplifying an RF signal 14. The ETIC 10 is coupled to the amplifier circuits 12(1)-12(N) via a number of amplifier ports 16(1)-16(N), respectively. The ETIC 10 includes a number of ET circuits 18(1)-18(N) that are coupled to the amplifier ports 16(1)-16(N), respectively. The ET circuits 18(1)-18(N) are configured to generate the ET voltages $V_{CC-1}$-$V_{CC-N}$ based on a number of ET target voltages $V_{TGT-1}$-$V_{TGT-N}$, respectively. In other words, the ET voltages $V_{CC-1}$-$V_{CC-N}$ are generated to rise and fall in accordance with the ET target voltages $V_{TGT-1}$-$V_{TGT-N}$, respectively. Understandably, the closer the ET voltages $V_{CC-1}$-$V_{CC-N}$ track the ET target voltages $V_{TGT-1}$-$V_{TGT-N}$, the more efficient the amplifier circuits 12(1)-12(N) will become.

In a non-limiting example, the amplifier circuits 12(1)-12(N) are configured to amplify the RF signal 14, which may have been modulated in same or different phase terms $\theta_1$-$\theta_N$, for concurrent transmission in a formed RF beam (also known as "beamforming"). In this regard, the ET circuits 18(1)-18(N) may be required to operate concurrently to provide the ET voltages $V_{CC-1}$-$V_{CC-N}$ to the amplifier circuits 12(1)-12(N), respectively. Notably, each of the ET circuits 18(1)-18(N) will draw a respective battery current while generating a respective ET voltage among the ET voltages $V_{CC-1}$-$V_{CC-N}$. As such, the ET circuits 18(1)-18(N) may cause a substantial amount of heat to potentially degrade performance of the ETIC 10.

Although the RF signal 14 may have been modulated in the phase terms $\theta_1$-$\theta_N$ prior to being amplified by the amplifier circuits 12(1)-12(N), some or all of the RF signal 14 in the phase terms $\theta_1$-$\theta_N$ can correspond to identical peak-to-peak signal amplitudes. In this regard, some or all of the ET circuits 18(1)-18(N) may generate an identical ET voltage among the ET voltages $V_{CC-1}$-$V_{CC-N}$ based on an identical ET target voltage among the ET target voltages $V_{TGT-1}$-$V_{TGT-N}$. As such, it may be possible to generate the identical ET voltage using a single ET circuit and power off some or all of the ET circuits 18(1)-18(N) to help reduce battery current drain and improve heat dissipation in the ETIC 10.

In this regard, the ETIC 10 is configured to include a reference ET circuit 20 in addition to the ET circuits 18(1)-18(N). The reference ET circuit 20 is configured to generate a reference ET voltage $V_{CCr}$ based on a maximum ET target voltage $V_{TGT-MAX}$ among the ET target voltages $V_{TGT-1}$-$V_{TGT-N}$. In one non-limiting example, the maximum ET target voltage $V_{TGT-MAX}$ can be equal to a maximum of the ET target voltages $V_{TGT-1}$-$V_{TGT-N}$. In another non-limiting example, the maximum ET target voltage $V_{TGT-MAX}$ can be equal to the maximum of the ET target voltages $V_{TGT-1}$-$V_{TGT-N}$ plus a headroom voltage (e.g., 0.1 V). In other words, the maximum ET target voltage $V_{TGT-MAX}$ is greater than or equal to any of the ET target voltages $V_{TGT-1}$-$V_{TGT-N}$.

Accordingly, at least one selected ET circuit among the ET circuits 18(1)-18(N) may be configured to stop providing a respective ET voltage $V_{CC1}$ to at least one selected amplifier port among the amplifier ports 16(1)-16(N) that is coupled to the selected ET circuit. Instead, the selected ET circuit can be configured to provide the reference ET voltage $V_{CCr}$ to the coupled amplifier port. Accordingly, it may be possible to partially or completely turn off the selected ET circuit to help reduce battery current drain and improve heat dissipation in the ETIC 10.

The selected ET circuit can be any ET circuit(s) among the ET circuits 18(1)-18(N) that may have been configured to receive a respective ET target voltage(s) that is equal to the maximum ET target voltage $V_{TGT-MAX}$ or less than the maximum ET target voltage $V_{TGT-MAX}$ by a defined margin (e.g., 0.1 V). For example, the ET circuit 18(1) may have been configured to receive the ET target voltage $V_{TGT-1}$ that equals the maximum ET target voltage $V_{TGT-MAX}$ or is less than the maximum ET target voltage $V_{TGT-MAX}$ by the defined margin. As such, the ET circuit 18(1) may become the selected ET circuit that is configured to stop providing the respective ET voltage $V_{CC1}$ to the amplifier port 16(1) and forward the reference ET voltage $V_{CCr}$ to the amplifier port 16(1) instead. Accordingly, the ET circuit 18(1) may be partially or completely turned off. Notably, as more of the ET circuits 18(1)-18(N) can operate as the selected ET circuit, more of the ET circuits 18(1)-18(N) can be partially or completely turned off and, therefore, more heat dissipation improvement can be achieved in the ETIC 10.

The ETIC 10 can be configured to include a direct current (DC) circuit 22, which may include a multi-level charge pump (MCP) 24 coupled in series to an inductor 26. In a non-limiting example, the MCP 24 can be a combination of micro-inductance-based and micro-capacitance-based buck-boost circuits configured to generate a number of DC voltages $V_{DC1}$-$V_{DCM}$ based on a battery voltage $V_{BAT}$. Although the MCP 24 is capable of generating the DC voltages $V_{DC1}$-$V_{DCM}$ at different levels, the MCP 24 is configured to output only a selected DC voltage $V_{DC}$ among the DC voltages $V_{DC1}$-$V_{DCM}$ at a given time. Accordingly, the inductor 26 can generate a direct current $I_{DC}$ based on the selected DC voltage $V_{DC}$.

The reference ET circuit 20 includes a reference voltage amplifier 28 (denoted as "R-AMP") and a reference controller 30 (denoted as "R-CONTROLLER"). The reference voltage amplifier 28 is configured to receive the maximum ET target voltage $V_{TGT-MAX}$ and generate an initial reference ET voltage $V'_{CCr}$ based on the maximum ET target voltage $V_{TGT-MAX}$. The reference voltage amplifier 28 may be coupled to a reference offset capacitor 32. The reference offset capacitor 32 may be configured to raise the initial reference ET voltage $V'_{CCr}$ by a reference offset voltage $V_{OFFr}$ (e.g., 0.8 V) to generate the reference ET voltage $V_{CCr}$ ($V_{CCr}=V'_{CCr}+V_{OFFr}$). In addition, the reference voltage amplifier 28 may also be configured to source a reference alternating current $I_{ACr}$ in accordance with the maximum ET target $V_{TGT-MAX}$.

In a non-limiting example, the reference ET circuit 20 and the DC circuit 22 are coupled to a coupling node 34. In this regard, the reference ET circuit 20 is configured to provide the reference ET voltage $V_{CCr}$ and the reference alternating current $I_{ACr}$ to the coupling node 34 and the DC circuit 22 is configured to provide the direct current $I_{DC}$ to the coupling node 34. The coupling node 34 may be coupled to the ET circuits 18(1)-18(N) to provide the reference ET voltage $V_{CCr}$ and a reference ET current $I_{CCr}$ ($I_{CCr}=I_{DC}+I_{ACr}$) to any of the ET circuits 18(1)-18(N).

The reference controller 30 may be configured to receive the initial reference ET voltage $V'_{CCr}$ and the reference ET voltage $V_{CCr}$. Accordingly, the reference controller 30 may determine a desired level of the direct current $I_{DC}$ based on the initial reference ET voltage $V'_{CCr}$ and/or the reference ET voltage $V_{CCr}$. Accordingly, the reference controller 30 may control the MCP 24 to output the selected DC voltage $V_{DC}$ that corresponds to the desired level of the direct current $I_{DC}$. The reference controller 30 may be further configured to control the reference voltage amplifier 28 (e.g., by adjusting supply voltage to output stage of the reference voltage amplifier 28) to change the initial reference ET voltage $V'_{CCr}$ and/or the reference alternating current $I_{ACr}$ in accordance with the maximum ET target voltage $V_{TGT-MAX}$.

The ET circuits 18(1)-18(N) include a number of switching/regulating circuits 36(1)-36(N), a number of voltage amplifiers 38(1)-38(N) (denoted as "AMP"), and a number of controllers 40(1)-40(N), respectively. The switching/regulating circuits 36(1)-36(N) include a number of inputs 42(1)-42(N) and a number of outputs 44(1)-44(N), respectively. Each of the inputs 42(1)-42(N) is coupled to the coupling node 34, and thus to the reference ET circuit 20 and the DC circuit 22. As such, each of the switching/regulating circuits 36(1)-36(N) may receive the reference ET voltage $V_{CCr}$, the direct current $I_{DC}$, and the reference alternating current $I_{ACr}$. The outputs 44(1)-44(N) are coupled to the amplifier ports 16(1)-16(N), respectively.

The voltage amplifiers 38(1)-38(N) are configured to generate a number of initial ET voltages $V'_{CC-1}$-$V'_{CC-N}$ based on the ET target voltages $V_{TGT-1}$-$V_{TGT-N}$, respectively. The voltage amplifiers 38(1)-38(N) may be coupled to a number of offset capacitors 46(1)-46(N), respectively. The offset capacitors 46(1)-46(N) are configured to raise the initial ET voltages $V'_{CC-1}$-$V'_{CC-N}$ by a number of offset voltages $V_{OFF-1}$-$V_{OFF-N}$ to generate the ET voltages $V_{CC-1}$-$V_{CC-N}$, respectively. The offset capacitors 46(1)-46(N) are coupled to the outputs 44(1)-44(N) to present the ET voltages $V_{CC-1}$-$V_{CC-N}$ at the outputs 44(1)-44(N), respectively. In addition, the voltage amplifiers 38(1)-38(N) may also be configured to source a number of alternating currents $I_{AC-1}$-$I_{AC-N}$ and present the alternating currents $I_{AC-1}$-$I_{AC-N}$ at the outputs 44(1)-44(N), respectively.

Given that the reference ET circuit 20 is configured to generate the reference ET voltage $V_{CCr}$ based on the maximum ET target voltage $V_{TGT-MAX}$ that is higher than or equal to any of the ET target voltages $V_{TGT-1}$-$V_{TGT-N}$, the reference ET voltage $V_{CCr}$ presented at the inputs 42(1)-42(N) will be higher than or equal to the ET voltages $V_{CC-1}$-$V_{CC-N}$ presented at the outputs 44(1)-44(N). As such, the switching/regulating circuits 36(1)-36(N) may prevent the direct current $I_{DC}$, the reference alternating current $I_{ACr}$, and the alternating currents $I_{AC-1}$-$I_{AC-N}$ from flowing back toward the reference ET circuit 20 and the DC circuit 22.

In a non-limiting example, the voltage amplifier 38(1) in the ET circuit 18(1) is configured to receive the ET target voltage $V_{TGT-1}$ that is either equal to the maximum ET target voltage $V_{TGT-MAX}$ or within the defined margin from the maximum ET target voltage $V_{TGT-MAX}$. As such, the controller 40(1) may be configured to deactivate the voltage amplifier 38(1) to stop providing the ET voltage $V_{CC-1}$ and the alternating current $I_{AC-1}$ to the amplifier port 16(1). Instead, the controller 40(1) may configure the switching/regulating circuit 36(1) to operate as a closed switch to couple the input 42(1) directly to the amplifier port 16(1) such that the amplifier port 16(1) can receive the reference ET voltage $V_{CCr}$, the direct current $I_{DC}$, and the reference alternating current $I_{ACr}$.

In the meantime, the rest of the voltage amplifiers 38(2)-38(N) may be configured to receive the ET target voltages $V_{TGT-2}$-$V_{TGT-N}$ that are below the maximum ET target voltage $V_{TGT-MAX}$ by more than the defined margin. In this regard, the controllers 40(2)-40(N) are configured to keep the voltage amplifiers 38(2)-38(N) activated to generate the ET voltages $V_{CC-2}$-$V_{CC-N}$ and the alternating currents $I_{AC-2}$-$I_{AC-N}$, respectively. Accordingly, the controllers 40(2)-40(N) may control the switching/regulating circuits 36(2)-36(N) to block the reference ET voltage $V_{CCr}$ and/or the reference alternating current $I_{ACr}$ from the amplifier ports 16(2)-16(N), respectively. Further, the controllers 40(2)-40(N) may configure the switching/regulating circuits 36(2)-36(N) to operate as regulators (e.g., low-dropout regulators) to adjust an amount of the direct current $I_{DC}$ flowing to the amplifier ports 16(2)-16(N), respectively. In a non-limiting example, the controllers 40(2)-40(N) may configure the switching/regulating circuits 36(2)-36(N) to adjust the amount of the direct current $I_{DC}$ flowing to the amplifier ports 16(2)-16(N) in accordance with the ET voltages $V_{CC-2}$-$V_{CC-N}$, respectively.

In another non-limiting example, instead of deactivating the voltage amplifier 38(1) in the ET circuit 18(1), the controller 40(1) may be configured to keep the voltage amplifier 38(1) activated to provide the ET voltage $V_{CC-1}$ to the amplifier port 16(1). The controller 40(1) may control the switching/regulating circuit 36(1) to block the reference ET voltage $V_{CCr}$. The controller 40(1) may configure the switching/regulating circuit 36(1) to operate as a regulator to regulate the direct current $I_{DC}$ and/or the reference alternating current $I_{ACr}$. For example, the controller 40(1) may configure the switching/regulating circuit 36(1) to pass one-half (½) of the reference alternating current $I_{ACr}$ and control the voltage amplifier 38(1) to supplement the other ½ of the reference alternating current $I_{ACr}$ ($I_{AC-1}=½I_{ACr}$).

In the event that all of the voltage amplifiers 38(1)-38(N) are configured to receive the ET target voltages $V_{TGT-1}$-$V_{TGT-N}$ that are either equal to the maximum ET target voltage $V_{TGT-MAX}$ or within the defined margin below the maximum ET target voltage $V_{TGT-MAX}$, the controllers 40(1)-40(N) may be configured to deactivate all of the voltage amplifiers 38(1)-38(N), respectively. In this regard, the controllers 40(1)-40(N) can configure all of the switching/regulating circuits 36(1)-36(N) to operate as switches to provide the reference ET voltage $V_{CCr}$, the direct current $I_{DC}$, and the reference alternating current $I_{ACr}$ to the amplifier ports 16(1)-16(N), respectively.

Alternatively, the controllers 40(1)-40(N) may also keep all of the voltage amplifiers 38(1)-38(N) activated to provide the ET voltages $V_{CC-1}$-$V_{CC-N}$ to the amplifier ports 16(1)-16(N), respectively. In addition, the controllers 40(1)-40(N) may configure the switching/regulating circuits 36(1)-36(N) to block the reference ET voltage $V_{CCr}$ from the amplifier ports 16(1)-16(N), respectively. Further, the controllers 40(1)-40(N) may control the switching/regulating circuits 36(1)-36(N) to regulate the direct current $I_{DC}$ and the reference alternating current $I_{ACr}$ that flow from the switching/regulating circuits 36(1)-36(N) to the amplifier ports 16(1)-16(N). Accordingly, the controllers 40(1)-40(N) may cause the voltage amplifiers 38(1)-38(N) to reduce or eliminate the alternating currents $I_{AC-1}$-$I_{AC-N}$ to help improve efficiency of the voltage amplifiers 38(1)-38(N).

The ETIC 10 may be provided in an ET amplifier apparatus to enable ET operation with improved heat dissipation. In this regard, FIG. 2 is a schematic diagram of an exemplary ET amplifier apparatus 48 incorporating the ETIC 10 of FIG. 1. Common elements between FIGS. 1 and 2 are shown therein with common element numbers and will not be re-described herein.

The ET amplifier apparatus 48 includes a target voltage circuit 50 configured to generate and provide the maximum ET target voltage $V_{TGT-MAX}$ and the ET target voltages $V_{TGT-1}$-$V_{TGT-N}$ to the ETIC 10. In a non-limiting example, the target voltage circuit 50 includes a voltage controller 52, a number of multipliers 54(1)-54(N), and a number of combiners 56(1)-56(N). The voltage controller 52 is configured to receive the maximum ET target voltage $V_{TGT-MAX}$ as an input and forward the maximum ET target voltage $V_{TGT-MAX}$ to the ETIC 10. The voltage controller 52 may be configured to provide the maximum ET target voltage $V_{TGT-MAX}$ to the multipliers 54(1)-54(N) configured to scale the maximum ET target voltage $V_{TGT-MAX}$ to generate the ET target voltages $V_{TGT-1}$-$V_{TGT-N}$ lower than or equal to the maximum ET target voltage $V_{TGT-MAX}$ based on a number of look-up tables (LUTs) corresponding to a number of slopes SLOPE$_1$-SLOPE$_N$, respectively. The combiners 56(1)-56(N) are configured to further adjust the ET target voltages V$_{TGT-1}$-V$_{TGT-N}$ based on a number of offset factors OFFSET$_1$-OFFSET$_N$, respectively. For an exemplary implementation of a target voltage circuit, such as the target voltage circuit 50, please refer to U.S. patent application Ser. No. 16/270,119, entitled "MULTI-VOLTAGE GENERATION CIRCUIT AND RELATED ENVELOPE TRACKING AMPLIFIER APPARATUS" and filed on Feb. 7, 2019.

The ET amplifier apparatus 48 may include or be coupled to a transceiver circuit 58 configured to generate the maximum ET target voltage V$_{TGT-MAX}$ and the RF signal 14. The ET amplifier apparatus 48 may also include a signal processing circuit 60 configured to modulate the RF signal 14 into the phase terms θ$_1$-θ$_N$ and provide the RF signal 14 in the phase terms θ$_1$-θ$_N$ to the amplifier circuits 12(1)-12(N), respectively.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (IC) (ETIC) comprising:
    a plurality of amplifier ports coupled to a plurality of amplifier circuits configured to amplify a radio frequency (RF) signal based on a plurality of ET voltages, respectively;
    a plurality of ET circuits coupled to the plurality of amplifier ports, respectively, and configured to:
        generate the plurality of ET voltages based on a plurality of ET target voltages, respectively; and
        provide the plurality of ET voltages to the plurality of amplifier ports, respectively; and
    a reference ET circuit configured to:
        generate a reference ET voltage based on a maximum ET target voltage among the plurality of ET target voltages; and
        provide the reference ET voltage to the plurality of ET circuits;
    wherein at least one selected ET circuit among the plurality of ET circuits is configured to:
        stop providing a respective ET voltage among the plurality of ET voltages to at least one selected amplifier port coupled to the at least one selected ET circuit; and
        provide the reference ET voltage to the at least one selected amplifier port coupled to the at least one selected ET circuit.

2. The ETIC of claim 1, wherein the at least one selected ET circuit is configured to receive a respective ET target voltage among the plurality of ET target voltages that equals the maximum ET target voltage.

3. The ETIC of claim 1, further comprising:
    a multi-level charge pump (MCP) configured to generate a plurality of direct current (DC) voltages based on a battery voltage; and
    an inductor coupled to the plurality of ET circuits and configured to generate a direct current based on a selected DC voltage among the plurality of DC voltages.

4. The ETIC of claim 3, wherein the reference ET circuit comprises:
    a reference voltage amplifier configured to generate the reference ET voltage based on the maximum ET target voltage; and
    a reference controller configured to:
        determine a desired level of the direct current based on the maximum ET target voltage; and
        control the MCP to output the selected DC voltage to cause the inductor to generate the direct current at the desired level.

5. The ETIC of claim 4, wherein the plurality of ET circuits comprises:
    a plurality of switching/regulating circuits comprising:
        a plurality of inputs each coupled to the inductor and the reference ET circuit to receive the direct current and the reference ET voltage; and
        a plurality of outputs coupled to the plurality of amplifier ports and configured to provide the direct current to the plurality of amplifier ports, respectively;
    a plurality of voltage amplifiers coupled to the plurality of outputs and configured to:
        generate the plurality of ET voltages based on the plurality of ET target voltages, respectively;
        generate a plurality of alternating currents based on the plurality of ET voltages, respectively; and
        provide the plurality of ET voltages and the plurality of alternating currents to the plurality of amplifier ports, respectively; and
    a plurality of controllers configured to control the plurality of switching/regulating circuits to regulate the direct current based on the plurality of ET voltages, respectively, prior to providing the direct current to the plurality of amplifier ports.

6. The ETIC of claim 5, wherein a respective controller in the at least one selected ET circuit is further configured to:
    deactivate a respective voltage amplifier to stop providing the respective ET voltage and a respective alternating current to the at least one selected amplifier port; and
    control a respective switching/regulating circuit to provide the reference ET voltage to the at least one selected amplifier port.

7. The ETIC of claim 6, wherein:
    the reference voltage amplifier is further configured to generate a reference alternating current based on the reference ET voltage; and
    the respective controller in the at least one selected ET circuit is further configured to control the respective switching/regulating circuit to cause the reference alternating current to be provided to the at least one selected amplifier port.

8. The ETIC of claim 5, wherein a respective controller in the at least one selected ET circuit is further configured to:
    cause a respective voltage amplifier to provide a respective alternating current to the at least one selected amplifier port; and
    control a respective switching/regulating circuit to block the reference ET voltage from the at least one selected amplifier port.

9. The ETIC of claim 8, wherein:
    the reference voltage amplifier is further configured to generate a reference alternating current based on the reference ET voltage; and
    the respective controller in the at least one selected ET circuit is further configured to control the respective switching/regulating circuit to regulate the reference alternating current.

10. An envelope tracking (ET) amplifier apparatus comprising:
    a plurality of amplifier circuits configured to amplify a radio frequency (RF) signal based on a plurality of ET voltages, respectively; and an ET integrated circuit (ETIC) comprising:
  a plurality of amplifier ports coupled to the plurality of amplifier circuits, respectively;
  a plurality of ET circuits coupled to the plurality of amplifier ports, respectively, and configured to:
    generate the plurality of ET voltages based on a plurality of ET target voltages, respectively; and
    provide the plurality of ET voltages to the plurality of amplifier ports, respectively; and
  a reference ET circuit configured to:
    generate a reference ET voltage based on a maximum ET target voltage among the plurality of ET target voltages; and
    provide the reference ET voltage to the plurality of ET circuits;
  wherein at least one selected ET circuit among the plurality of ET circuits is configured to:
    stop providing a respective ET voltage among the plurality of ET voltages to at least one selected amplifier port coupled to the at least one selected ET circuit; and
    provide the reference ET voltage to the at least one selected amplifier port coupled to the at least one selected ET circuit.

11. The ET amplifier apparatus of claim 10, wherein the at least one selected ET circuit is configured to receive a respective ET target voltage among the plurality of ET target voltages that equals the maximum ET target voltage.

12. The ET amplifier apparatus of claim 10, wherein the ETIC further comprises:
  a multi-level charge pump (MCP) configured to generate a plurality of direct current (DC) voltages based on a battery voltage; and
  an inductor coupled to the plurality of ET circuits and configured to generate a direct current based on a selected DC voltage among the plurality of DC voltages.

13. The ET amplifier apparatus of claim 12, wherein the reference ET circuit comprises:
  a reference voltage amplifier configured to generate the reference ET voltage based on the maximum ET target voltage; and
  a reference controller configured to:
    determine a desired level of the direct current based on the maximum ET target voltage; and
    control the MCP to output the selected DC voltage to cause the inductor to generate the direct current at the desired level.

14. The ET amplifier apparatus of claim 13, wherein the plurality of ET circuits comprises:
  a plurality of switching/regulating circuits comprising:
    a plurality of inputs each coupled to the inductor and the reference ET circuit to receive the direct current and the reference ET voltage; and
    a plurality of outputs coupled to the plurality of amplifier ports and configured to provide the direct current to the plurality of amplifier ports, respectively;
  a plurality of voltage amplifiers coupled to the plurality of outputs and configured to:
    generate the plurality of ET voltages based on the plurality of ET target voltages, respectively;
    generate a plurality of alternating currents based on the plurality of ET voltages, respectively; and
    provide the plurality of ET voltages and the plurality of alternating currents to the plurality of amplifier ports, respectively; and
  a plurality of controllers configured to control the plurality of switching/regulating circuits to regulate the direct current based on the plurality of ET voltages, respectively, prior to providing the direct current to the plurality of amplifier ports.

15. The ET amplifier apparatus of claim 14, wherein a respective controller in the at least one selected ET circuit is further configured to:
  deactivate a respective voltage amplifier to stop providing the respective ET voltage and a respective alternating current to the at least one selected amplifier port; and
  control a respective switching/regulating circuit to provide the reference ET voltage to the at least one selected amplifier port.

16. The ET amplifier apparatus of claim 15, wherein:
  the reference voltage amplifier is further configured to generate a reference alternating current based on the reference ET voltage; and
  the respective controller in the at least one selected ET circuit is further configured to control the respective switching/regulating circuit to cause the reference alternating current to be provided to the at least one selected amplifier port.

17. The ET amplifier apparatus of claim 14, wherein a respective controller in the at least one selected ET circuit is further configured to:
  cause a respective voltage amplifier to provide a respective alternating current to the at least one selected amplifier port; and
  control a respective switching/regulating circuit to block the reference ET voltage from the at least one selected amplifier port.

18. The ET amplifier apparatus of claim 17, wherein:
  the reference voltage amplifier is further configured to generate a reference alternating current based on the reference ET voltage; and
  the respective controller in the at least one selected ET circuit is further configured to control the respective switching/regulating circuit to regulate the reference alternating current.

19. The ET amplifier apparatus of claim 10, further comprising a target voltage circuit configured to:
  receive the maximum ET target voltage;
  provide the maximum ET target voltage to the reference ET circuit;
  scale the maximum ET target voltage to generate the plurality of ET target voltages to be lower than or equal to the maximum ET target voltage; and
  provide the plurality of ET target voltages to the plurality of ET circuits, respectively.

20. The ET amplifier apparatus of claim 19, further comprising a transceiver circuit configured to:
  generate and provide the maximum ET target voltage to the target voltage circuit;
  generate the RF signal in a plurality of phase terms; and
  provide the RF signal in the plurality of phase terms to the plurality of amplifier circuits, respectively, for concurrent transmission.

* * * * *